United States Patent
Hwang

(10) Patent No.: US 8,358,161 B2
(45) Date of Patent: Jan. 22, 2013

(54) BUFFER ENABLE SIGNAL GENERATING CIRCUIT AND INPUT CIRCUIT USING THE SAME

(75) Inventor: Mi Hyun Hwang, Anyang-si (KR)

(73) Assignee: Hynix Semiconductor Inc., Icheon-si (KR)

(*) Notice: Subject to any disclaimer, the term of this patent is extended or adjusted under 35 U.S.C. 154(b) by 0 days.

(21) Appl. No.: 13/209,239

(22) Filed: Aug. 12, 2011

(65) Prior Publication Data

US 2012/0025872 A1     Feb. 2, 2012

Related U.S. Application Data

(63) Continuation of application No. 12/455,783, filed on Jun. 4, 2009, now Pat. No. 8,022,735.

(30) Foreign Application Priority Data

Dec. 5, 2008   (KR) .................... 10-2008-0123553

(51) Int. Cl.
*H03K 3/017*   (2006.01)
(52) U.S. Cl. ..................................... 327/172
(58) Field of Classification Search ............... None
See application file for complete search history.

(56) References Cited

U.S. PATENT DOCUMENTS

| | | | |
|---|---|---|---|
| 7,515,487 B2 | 4/2009 | Seo et al. | |
| 7,602,656 B2 | 10/2009 | Lee | |
| 2001/0010653 A1 | 8/2001 | Wakasugi et al. | |
| 2004/0136402 A1 | 7/2004 | Ozawa | |
| 2006/0197565 A1* | 9/2006 | Kang ............................ | 327/158 |
| 2008/0018371 A1 | 1/2008 | Suda et al. | |
| 2008/0159040 A1 | 7/2008 | Mochida | |
| 2009/0089517 A1 | 4/2009 | Imai et al. | |
| 2009/0284290 A1 | 11/2009 | Kuroki et al. | |

FOREIGN PATENT DOCUMENTS

| | | | |
|---|---|---|---|
| KR | 10-2006-0032671 A | 4/2006 | |
| KR | 10-2006-0135227 A | 12/2006 | |

* cited by examiner

*Primary Examiner* — Lincoln Donovan
*Assistant Examiner* — Sibin Chen
(74) *Attorney, Agent, or Firm* — John P. White; Cooper & Dunham LLP

(57) ABSTRACT

An input circuit comprises a buffer enable signal generating circuit for generating a buffer enable signal having an predetermined enable period in response to an external command, and a buffer circuit for buffering and outputting the external command and an external address signal in response to the buffer enable signal.

13 Claims, 4 Drawing Sheets

BUFFER ENABLE SIGNAL GENERATING CIRCUIT AND INPUT CIRCUIT USING THE SAME

CROSS REFERENCE TO RELATED APPLICATIONS

This application is a continuation of U.S. application Ser. No. 12/455,783, filed Jun. 4, 2009, now U.S. Pat. No. 8,022,735 claiming priority of Korean Patent Application No. 10-2008-0123553, filed Dec. 5, 2008.

TECHNICAL FIELD

The present invention relates to an input circuit of a semiconductor memory device, and more particularly, to a buffer enable signal generating circuit which controls an activation state in response to an external command to thereby reduce unnecessary current consumption, and an input circuit using the same.

BACKGROUND

With recent development of relevant technologies, semiconductor devices continuously advance toward higher integration and higher speed and are used in a variety of products from large home appliances to small mobile products.

In general, semiconductor devices are designed with an objective to consume less power and realize higher operation speed. To this end, the semiconductor memory device is provided with a power down mode which stops operation of internal circuits including an address buffer and a command buffer, to reduce unnecessary current consumption when the semiconductor device is maintained in a standby state for a certain period.

This power down mode will be described with reference to FIG. 1.

FIG. 1 is a block diagram illustrating a conventional input circuit of a semiconductor memory device.

The input circuit includes an address buffer 500 and a command buffer 600.

The address buffer 500 buffers external address signals ADD<1:4> in response to an internal clock ICLK to generate internal address signals IADD<1:4>.

The command buffer 600 buffers a chip selection signal/CS, a RAS signal/RAS, a CAS signal/CAS and a write enable signal/WE in response to the internal clock ICLK to generate an internal chip selection signal/ICS, an internal RAS signal/IRAS, an internal CAS signal/ICAS and an internal write enable signal/IWE. As described above, the address buffer 500 and the command buffer 600 receive external signals in synchronization with the internal clock ICLK to generate internal signals.

When the address buffer 500 and command buffer 600 enter into a power down mode, the internal clock ICLK is disabled and operations of the address buffer 500 and the command buffer 600 are stopped. That is to say, unnecessary current consumption of the address buffer 500 and the command buffer 600 is reduced upon the power down mode.

Meanwhile, when the power down mode is ended and the address buffer 500 and the command buffer 600 enter into the non power down mode, the internal clock ICLK is enabled and the operation of the address buffer 500 and the command buffer 600 are resumed. In the non power down mode, the semiconductor memory device performs read operation, write operation and precharge operation according to the external command, and the address buffer 500 and the command buffer 600 are maintained in the activation state regardless of whether the external command is inputted or not since the internal clock ICLK is in an enabled state. That is to say, continuous current consumption is generated through the address buffer 500 and the command buffer 600 during the non power down mode. Particularly, as a memory capacity of a semiconductor memory device is increased, the number of the external address signal and the number of the address buffer for buffering the external address signal are also increased to result in unnecessary consumption of more current.

SUMMARY

In an aspect of this disclosure, there is provided an input circuit which activates an input buffer for a certain period when an external command is inputted but inactivates the input buffer in a standby state for the external command to reduce unnecessary current consumption.

In an embodiment, a buffer enable signal generating circuit comprising a reset signal generating unit for generating a reset signal having an enable period determined in response to external commands and a chip selection signal, and a RS latch for generating a buffer enable signal for controlling a buffer circuit in response to the reset signal and the chip selection signal, wherein the chip selection signal is enabled to select a chip entering an activation state.

In other embodiment, a buffer enable signal generating circuit comprising a reset signal generating unit for generating a reset signal having an enable period determined in response to a first external command and a chip selection signal, and a RS latch for generating a buffer enable signal for controlling a buffer circuit in response to the reset signal and the chip selection signal, wherein the chip selection signal is enabled to select a chip entering an activation state.

BRIEF DESCRIPTION OF THE DRAWINGS

The above and other aspects, features and other advantages will be more clearly understood from the following detailed description taken in conjunction with the accompanying drawings, in which.

DESCRIPTION OF EXEMPLARY EMBODIMENTS

Hereinafter, exemplary embodiments of the present invention will be described with reference to accompanying drawings. However, the embodiments are for illustrative purposes only and are not intend to limit the scope of the invention.

Figure 1:
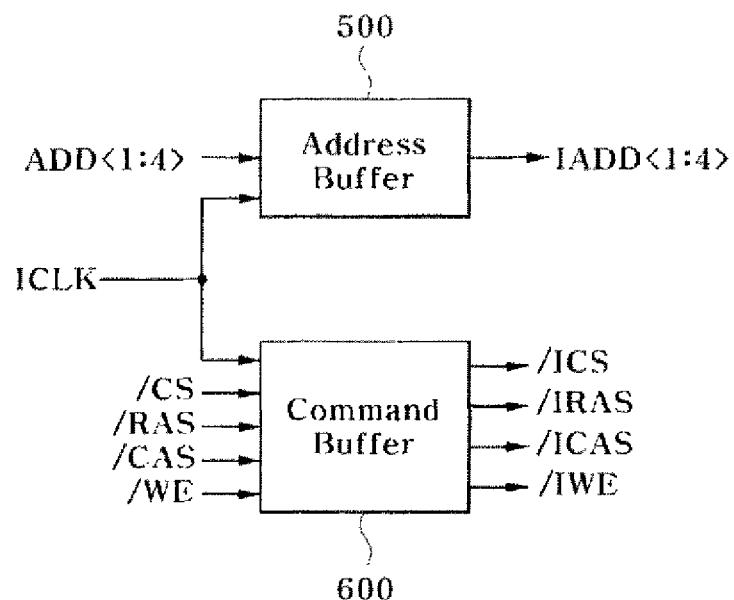
FIG. 1 is a block diagram illustrating a conventional input circuit of a semiconductor memory device.
Figure 2:
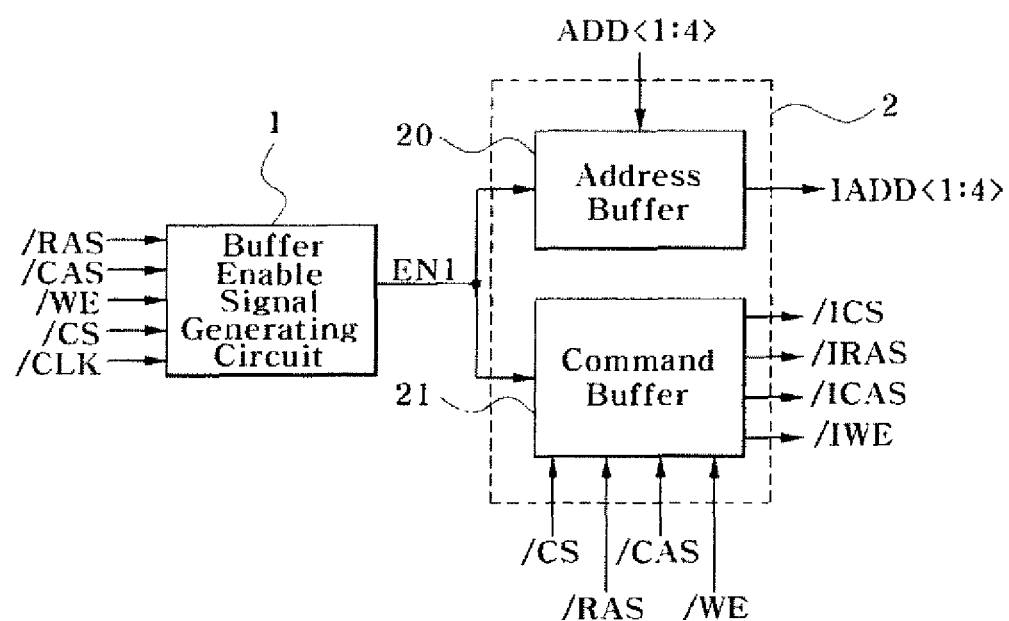
FIG. 2 is a block diagram illustrating the structure of an input circuit using a buffer enable signal generating circuit in accordance with a first embodiment of the present invention.

FIG. 2 is a block diagram illustrating the structure of an input circuit using a buffer enable signal generating circuit in accordance with a first embodiment of the present invention.

An input circuit in accordance with the present embodiment comprises buffer enable signal generating circuit 1 and a buffer circuit 2.

Figure 3:
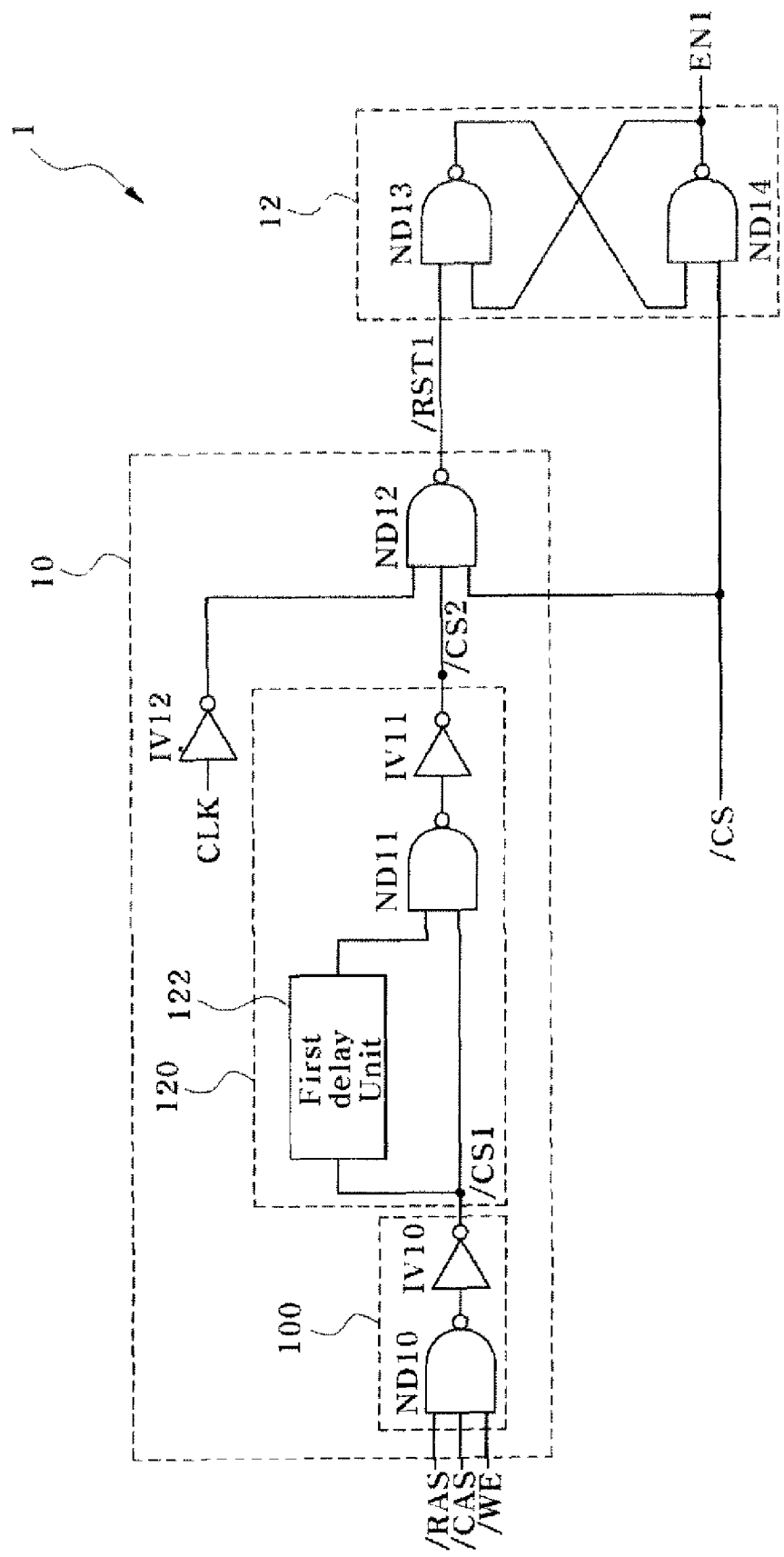
FIG. 3 is a diagram illustrating the buffer enable signal generating circuit in FIG. 2.

The buffer enable signal generating circuit 1 comprises a reset signal generating unit 10 and a RS latch 12 as shown in FIG. 3, and receives a RAS signal/RAS, a CAS signal/CAS, a write enable to signal/WE and a chip selection signal/CS to generate a first buffer enable signal EN1 for controlling an operation of the buffer circuit 2. The chip selection signal/CS is enabled to select a chip entering an activation state.

The reset signal generating unit 10 comprises a control signal generating unit 100, a pulse width adjusting unit 120 and a NAND gate ND12.

The control signal generating unit 100 comprises a NAND gate ND10 which performs a NAND operation on the RAS signal/RAS, the CAS signal/CAS and the write enable signal/WE and an inverter IV10 which inverts the output signal from the NAND gate ND10 to generate a first control signal/CS1. The first control signal/CS1 is enabled to a low level when one of the RAS signal/RAS, the CAS signal/CAS and the write enable signal/WE is enabled to a low level.

The pulse width adjusting unit 120 comprises a first delay unit 122 which delays the first control signal/CS1 for a first predetermined period, a NAND gate ND11 which performs a NAND operation on the output from the first delay unit 122 and the first control signal/CS1 and an inverter IV11 which inverts the output signal from the NAND gate ND11 to generate the second control signal/CS2. That is to say, an enable period of the second control signal/CS2 is larger than an enable period of the first control signal/CS1 by the first predetermined period of the first delay unit 122.

The NAND gate ND12 performs a NAND operation on the inverted signal of a clock signal CLK, the second control signal/CS2 and the chip selection signal/CS to generate a first reset signal/RST1. That is to say, the first reset signal/RST1 is disabled to a high level when the chip selection signal/CS is enabled to a low level or the second control signal/CS2 is enabled to a low level.

The RS latch 12 comprises a NAND gate ND13 and a NAND gate ND14 and generates the first buffer enable signal EN1 in response to the chip selection signal/CS and the first reset signal/RST1. The first buffer enable signal EN1 is enabled to a high level when the chip selection signal/CS is enabled to a low level. The first buffer enable signal EN1 is disabled to a low level when the first reset signal/RST1 is enabled to a low level. That is to say, the first buffer enable signal EN1 is disabled to a low level after lapse of the first predetermined period of the first delay unit 122 from the period where one of the RAS signal/RAS, the CAS signal/CAS and the write enable signal/WE is enabled to a low level.

The buffer circuit 2 comprises an address buffer 20 and a command buffer 21.

Figure 4:
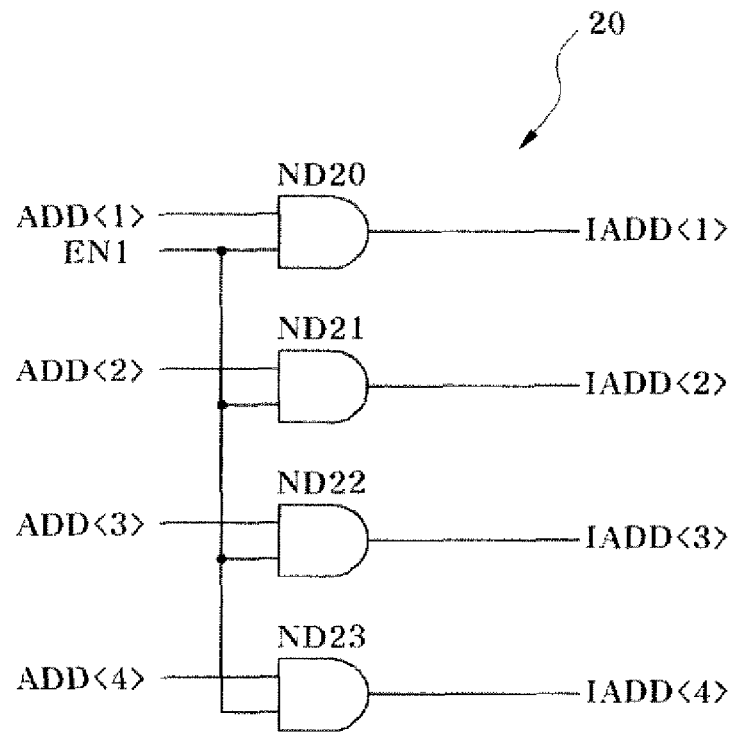
FIG. 4 is a diagram illustrating an address buffer in FIG. 2.

The address buffer 20 comprises, as shown in FIG. 4, a plurality of NAND gates ND20-ND23 which buffer external address signals ADD<1:4> in response to the first buffer enable signal EN1 to generate internal address signals IADD<1:4>, respectively. The NAND gates ND20-ND23 of the address buffer 20 perform buffering operations when the first buffer enable signal EN1 is enabled to a high level and stop buffering the external address signals ADD<1:4> when the first buffer enable signal EN1 is disabled to a low level.

Figure 5:
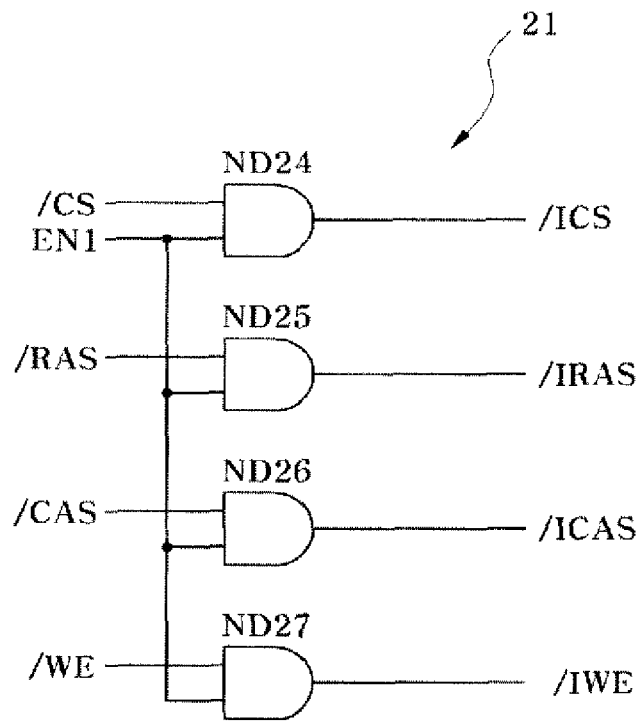
FIG. 5 is a diagram illustrating a command buffer in FIG. 2.

Meanwhile, the command buffer 21 comprises, as shown in FIG. 5, a plurality of NAND gates ND24-ND27 which buffer the chip selection signal/CS, the RAS signal/RAS, the CAS signal/CAS and the write enable signal/WE in response to the first buffer enable signal EN1 to generate the internal chip selection signal/ICS, the internal RAS signal/IRAS, the internal CAS signal/ICAS and the internal write enable signal/IWE, respectively. The NAND gates ND24-ND27 of the command buffer 21 perform buffering operations when the first buffer enable signal EN1 is enabled to a high level and stop buffering the chip selection signal/CS, the RAS signal/RAS, the CAS signal/CAS and the write enable signal/WE when the first buffer enable signal EN1 is disabled to a low level.

Operation of the input circuit having the structure described above will be described.

First, the RAS signal/RAS, the CAS signal/CAS, the write enable signal/WE and the chip selection signal/CS are all at a high level before an external command is inputted. Therefore, the reset signal generating unit 10 generates the second control signal/CS2 at a high level generated by lengthening the enable period of the first control signal/CS1 at a high level by the first predetermined period of the first delay unit 122. More specifically, the control signal generating unit 100 receives the RAS signal/RAS at a high level, the CAS signal/CAS at a high level and the write enable signal/WE at a high level to generate the first control signal/CS1 at a high level, and the pulse width adjusting unit 120 receives the first control signal/CS1 to generate the second control signal/CS2 which is delayed by the first predetermined period of the first delay unit 122. At this time, since the chip selection signal/CS is also disabled to a high level, a level of the first reset signal/RST1 generated in the NAND gate ND12 is changed according to the level of the clock signal CLK. That is to say, the first reset signal/RST1 becomes a low level when the clock signal CLK is shifted to a low level and the first reset signal/RST1 becomes a high level when the clock signal CLK is shifted to a high level.

Meanwhile, when one of the RAS signal/RAS, the CAS signal/CAS and the write enable signal/WE is enabled to a low level, the control signal generating unit 100 generates the first control signal/CS1 which is enabled to a low level. The pulse width adjusting unit 120 delays the enable period of the first control signal/CS1 for the predetermined period of the first delay unit 122 and generates the second control signal/CS2. At this time, the first reset signal/RST1 is disabled to a high level regardless of the chip selection signal/CS or the clock signal CLK during the enable period of the second control signal/CS2 at a low level.

The RS latch 12 generates the first buffer enable signal EN1 for controlling operations of the address buffer 20 and the command buffer 21 in response to the first reset signal/RST1 and the chip selection signal/CS. More specifically, when the chip selection signal/CS is disabled to a high level, the RS latch 12 disables the first buffer enable signal EN1 at a low level and latches the first buffer enable signal EN1. Here, a voltage level of the first reset signal/RST1 changes according to a level of the clock signal CLK.

However, when the chip selection signal/CS is enabled to a low level as the external command is inputted, the first reset signal/RST is disabled to a high level through the NAND gate ND12 and the first buffer enable signal EN1 is enabled to a high level. Also, when one of the RAS signal/RAS, the CAS signal/CAS and the write enable signal/WE is enabled to a low level, the control signal generating unit 100 generates the first control signal/CS1 enabled at a low level and the low level period of the first control signal/CS1 is lengthened through the pulse width adjusting unit 120 by the first predetermined period of the first delay unit 122 to generate the second control signal/CS2. Therefore, the NAND gate ND12 generates the first reset signal/RST1 which is disabled to a high level during the enable period of the second control signal/CS2 at a low level. Since the first reset signal/RST1 is maintained at a high level for a certain period even when the chip selection signal is disabled to a high level again, the enabled state of the first buffer enable signal EN1 at a high level is maintained for a certain period.

The address buffer 20 is activated during the enable period of the first buffer enable signal EN1 at a high level and buffers the external address signals ADD<1:4> to output the internal address signals IADD<1:4>. Also, the command buffer 21 is activated during the enable period of the first buffer enable signal EN1 at a high level and buffers the RAS signal/RAS, the CAS signal/CAS and the write enable signal/WE to output the internal RAS signal/IRAS, the internal CAS signal/ICAS and the internal write enable signal/IWE.

As described above, the buffer enable signal generating circuit 1 generates the first buffer enable signal EN1 enabled to a high level when the chip selection signal/CS is enabled to a low level. At this time, the first buffer enable signal EN1 is disabled after lapse of the first predetermined period of the first delay unit 122 from the period where one of the RAS signal/RAS, the CAS signal/CAS and the write enable signal/WE is enabled to a low level.

The reset signal generating unit 10 in accordance with the first embodiment of the present invention generates the first reset signal/RST1 which is enabled to a low level for a certain period when one of the RAS signal/RAS, the CAS signal/CAS and the write enable signal/WE is enabled. Since the RAS signal/RAS is inputted first among the three signals in actual driving, it may be possible to generate the first reset signal/RST1 only with the RAS signal/RAS which is inputted first.

Figure 6:
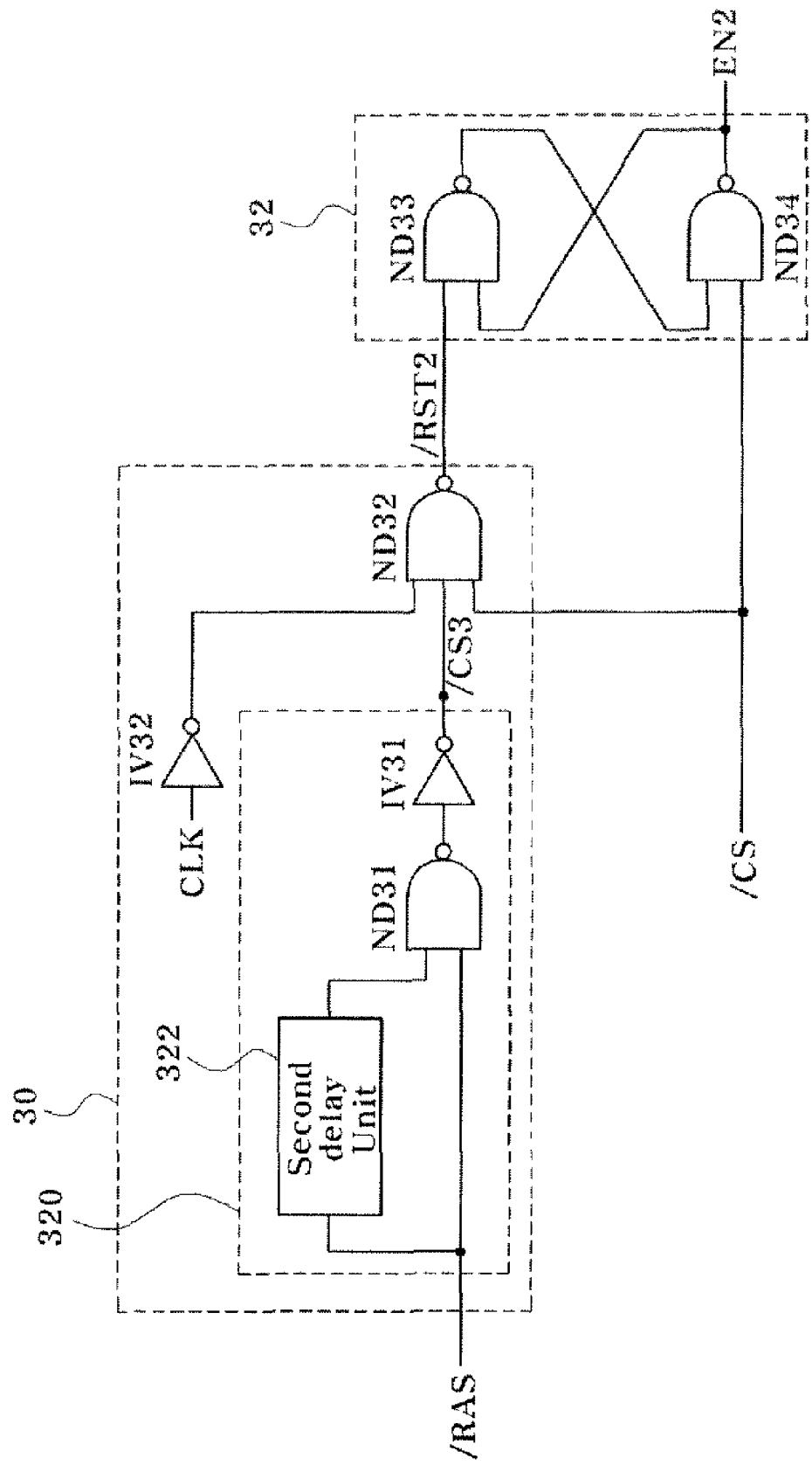
FIG. 6 is a diagram illustrating the structure of an input circuit using a buffer enable signal generating circuit in accordance with a second embodiment of the present invention.

FIG. 6 is a diagram illustrating the structure of an input circuit using a buffer enable signal generating circuit in accordance with a second embodiment of the present invention.

The buffer enable signal generating circuit in accordance with the present embodiment comprises, as shown in FIG. 6, a reset signal generating unit 30 having a pulse width adjusting unit 320 and a NAND gate ND 32, and a RS latch 32.

The pulse width adjusting unit 320 comprises a second delay unit 322 which receives the RAS signal/RAS and delays the RAS signal/RAS for a second predetermined period, a NAND gate ND31 which performs a NAND operation on the output from the second delay unit 322 and the RAS signal/RAS inputted thereto and an inverter IV31 which inverts the output signal from the NAND gate ND31 to generate the third control signal/CS3.

In the second embodiment, the reset signal generating unit 30 does not require the control signal generating unit 100 since the reset signal generating unit 30 does not receive the CAS signal/CAS and the write enable signal/WE but only the RAS signal/RAS. That is to say, the pulse width adjusting unit 320 directly receives the RAS signal/RAS to output the third control signal/CS3 which is generated by lengthening the enable period of the RAS signal/RAS at a low level by the second predetermined period of the second delay unit 322. The second predetermined period of the second delay unit 322 may be set so that the enable period of the third control signal/CS3 can be maintained until the CAS signal/CAS and the write enable signal/WE are inputted after the RAS signal/RAS is inputted.

The NAND gate ND32 performs a NAND operation on the inverted signal of a clock signal CLK, the third control signal/CS3 and the chip selection signal/CS inputted thereto to generate a second reset signal/RST2. That is to say, the second reset signal/RST2 is disabled to a high level when the chip selection signal/CS is enabled to a low level or the third control signal/CS3 is enabled to a low level.

The RS latch 32 comprises a NAND gate ND33 and a NAND gate ND34 and generates a second buffer enable signal EN2 in response to the second reset signal/RST2 and the chip selection signal/CS.

Operation of the buffer enable signal generating circuit in accordance with the second embodiment having the structure described above will be described.

First, in a state that both the RAS signal/RAS and the chip selection signal/CS are disabled to high levels before an external command is inputted, the pulse width adjusting unit 320 receives the RAS signal/RAS at a high level and generates the third control signal/CS3 which is delayed by the second predetermined period of the second delay unit 322. More specifically, the NAND gate ND31 performs a NAND operation on the RAS signal/RAS and the RAS signal/RAS delayed through the second delay unit 322 by the second predetermined period of the second delay unit inputted thereto and the inverter IV31 inverts the output signal from the NAND gate ND31 to generate the third control signal/CS3. At this time, since the chip selection signal/CS is also at a high level, the NAND gate ND32 determines the level of the second reset signal/RST2 according to the level of the clock signal CLK.

After that, when the chip selection signal/CS is enabled to a low level, the NAND gate ND32 generates the second reset signal/RST2 which is disabled to a high level and the second buffer enable signal EN2 is enabled to a high level by the chip selection signal/CS at a low level. Also, when the RAS signal/RAS is enabled to a low level, the pulse width adjusting unit 320 receives the RAS signal/RAS and outputs the third control signal/CS3 having a pulse width increased by the second predetermined period of the second delay unit 322. Therefore, even when the chip selection signal/CS is disabled to a high level, an enable period of the second reset signal/RST2 is maintained for an enable period of the third control signal/CS3 at a low level. That is to say, the second buffer enable signal EN2 is maintained at an enabled state at a high level for the enabling period of the third control signal/CS3 at a low level. Therefore, the address buffer and the command buffer are activated during the enable period of the third control signal/CS3 at a low level where the pulse width of the RAS signal/RAS is enlarged by the second predetermined period of the second delay unit 322.

As is apparent from the above description, the buffer enable signal generating circuit in accordance with the first and second embodiments of the present invention enables the buffer enable signal to activate the address buffer and the command buffer when the chip selection signal/CS is enabled, and disables the buffer enable signal after lapse of a certain period to inactivate the address buffer and the command buffer when one of the RAS signal/RAS, the CAS signal/CAS and the write enable signal/WE is enabled. That is to say, the address buffer and the command buffer are activated for a certain period only when the external command is inputted, thereby reducing unnecessary current consumption in a standby state in which the external command is not inputted.

While the present invention has been described with respect to the specific embodiments, it will be apparent to those skilled in the art that various changes and modifications may be made without departing from the spirit and scope of the invention as defined in the following claims.

The present application claims priority to Korean application number 10-2008-0123553, filed on Dec. 5, 2008, which is incorporated by reference in its entirety.

What is claimed is:

1. A buffer enable signal generating circuit, comprising:
   a reset signal generating unit for generating a reset signal having an enable period determined in response to first through third external commands and a chip selection signal; and
   a RS latch for generating a buffer enable signal for controlling a buffer circuit in response to the reset signal and the chip selection signal, wherein the chip selection signal is enabled to select a chip entering an activation state, and the buffer circuit comprises an address buffer for buffering an external address signal and outputting a buffered signal in response to the buffer enable signal, and a command buffer for buffering the first through third external commands and outputting buffered commands in response to the buffer enable signal.

2. The buffer enable signal generating circuit of claim 1, wherein the reset signal is disabled when the chip selection signal is enabled.

3. The buffer enable signal generating circuit of claim 1, wherein the reset signal generating unit includes:
   a control signal generating unit for generating a first control signal which is enabled when one of the first through third external commands is enabled;
   a pulse width adjusting unit for generating a second control signal by lengthening the enable period of the first control signal by a predetermined period; and
   a logic device for generating the reset signal disabled when the chip selection signal or the second control signal is enabled.

4. The buffer enable signal generating circuit of claim 3, wherein the first through third external commands are a RAS (Row Address Strobe) signal, a CAS (Column Address Strobe) signal and a write enable signal.

5. The buffer enable signal generating circuit of claim 3, wherein the reset signal is enabled after lapse of a certain period from a period where one of the first through third external commands is enabled.

6. The buffer enable signal generating circuit of claim 1, wherein the buffer enable signal is enabled when the chip selection signal is enabled.

7. The buffer enable signal generating circuit of claim 1, wherein the buffer enable signal is disabled when the reset signal is enabled.

8. The buffer enable signal generating circuit of claim 1, wherein the buffer circuit is activated when the buffer enable signal is enabled.

9. A buffer enable signal generating circuit, comprising:
   a reset signal generating unit for generating a reset signal having an enable period determined in response to a first external command and a chip selection signal; and
   a RS latch for generating the buffer enable signal for controlling a buffer circuit in response to the reset signal and the chip selection signal,
   wherein the chip selection signal is enabled to select a chip entering an activation state, and the buffer circuit comprises an address buffer for buffering an external address signal and outputting a buffered signal in response to the buffer enable signal, and a command buffer for buffering the first external command and outputting buffered commands in response to the buffer enable signal.

10. The buffer enable signal generating circuit of claim 9, wherein the reset signal is disabled when the chip selection signal is enabled.

11. The buffer enable signal generating circuit of claim 9, wherein the reset signal is enabled after lapse of a certain period from a period where the first external command is enabled.

12. The buffer enable signal generating circuit of claim 9, wherein the reset signal generating unit comprises:
    a pulse width adjusting unit for generating a control signal by lengthening an enable period of the first external command by a predetermined period; and
    a logic device for generating the reset signal disabled when the chip selection signal or the control signal is enabled.

13. The buffer enable signal generating circuit of claim 9, wherein the first external command is a RAS (Row Address Strobe) signal.

* * * * *